(12) United States Patent
Song

(10) Patent No.: US 9,331,697 B2
(45) Date of Patent: May 3, 2016

(54) OUTPUT APPARATUS AND OUTPUT SYSTEM INCLUDING THE SAME

(71) Applicant: SK hynix Inc., Icheon-si Gyeonggi-do (KR)

(72) Inventor: Ho Uk Song, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 70 days.

(21) Appl. No.: 14/083,958

(22) Filed: Nov. 19, 2013

(65) Prior Publication Data

US 2015/0008963 A1  Jan. 8, 2015

(30) Foreign Application Priority Data

Jul. 5, 2013  (KR) .......................... 10-2013-0079074

(51) Int. Cl.
*H03K 3/00* (2006.01)
*H03K 19/003* (2006.01)

(52) U.S. Cl.
CPC ................................ *H03K 19/00361* (2013.01)

(58) Field of Classification Search
None
See application file for complete search history.

(56) References Cited

U.S. PATENT DOCUMENTS

| | | | | |
|---|---|---|---|---|
| 4,329,600 A * | 5/1982 | Stewart | ............................ | 361/89 |
| 5,512,854 A * | 4/1996 | Park | ............................... | 327/374 |
| 5,623,221 A * | 4/1997 | Miyake | ......................... | 327/108 |
| 6,307,409 B1 * | 10/2001 | Wrathall | ........................ | 327/112 |
| 6,414,524 B1 * | 7/2002 | Chen | ............................. | 327/112 |
| 7,098,704 B2 * | 8/2006 | Ikezaki | ......................... | 327/112 |
| 7,449,913 B1 * | 11/2008 | Hung | .............................. | 326/27 |
| 8,063,673 B2 * | 11/2011 | Masleid | ......................... | 327/112 |
| 2001/0026178 A1 * | 10/2001 | Itoh et al. | ....................... | 327/112 |
| 2002/0180495 A1 * | 12/2002 | Motoyui | ........................ | 327/108 |
| 2003/0034807 A1 * | 2/2003 | Hausmann | ..................... | 327/108 |
| 2005/0068071 A1 | 3/2005 | Waldrop | | |
| 2007/0001716 A1 * | 1/2007 | Sanchez et al. | ............... | 327/112 |
| 2009/0167368 A1 * | 7/2009 | Chan et al. | ..................... | 327/108 |
| 2010/0164556 A1 * | 7/2010 | Masleid | ......................... | 327/108 |
| 2010/0164557 A1 * | 7/2010 | Masleid et al. | ............... | 327/108 |
| 2011/0267112 A1 * | 11/2011 | Lee et al. | ....................... | 327/108 |
| 2012/0099383 A1 | 4/2012 | Kim et al. | | |
| 2015/0008963 A1 * | 1/2015 | Song | .............................. | 327/108 |

FOREIGN PATENT DOCUMENTS

| | | |
|---|---|---|
| KR | 1020050070989 A | 7/2005 |
| KR | 1020070070989 A | 7/2007 |
| KR | 1020070103907 A | 10/2007 |
| KR | 1020120040775 A | 4/2012 |
| WO | 2005064393 A1 | 7/2005 |

* cited by examiner

*Primary Examiner* — Lincoln Donovan
*Assistant Examiner* — Khareem E Almo
(74) *Attorney, Agent, or Firm* — William Park & Associates Ltd.

(57) ABSTRACT

An output apparatus includes an output driving unit configured to drive a final output signal; an output compensating signal generation unit configured to generate a delayed output signal by delaying the output signal by a predetermined time, and generate an output compensating signal based on the delayed output signal and the output signal; and an output driving compensation unit configured to compensate for the final output signal to a level opposite to a level to which the final output signal is driven.

16 Claims, 3 Drawing Sheets

OUTPUT APPARATUS AND OUTPUT SYSTEM INCLUDING THE SAME

CROSS-REFERENCES TO RELATED APPLICATION

The present application claims priority under 35 U.S.C. §119(a) to Korean application number 10-2013-0079074, filed on Jul. 5, 2013, in the Korean Intellectual Property Office, which is incorporated herein by reference in its entirety.

BACKGROUND

1. Technical Field

Various embodiments relate to an output apparatus, and more particularly, to an output apparatus which includes a unit for removing noise accompanying an output signal and an output system including the same.

2. Related Art

An electronic apparatus may output data by identifying two states of '0' and '1'. Accordingly, the data outputted from an electronic apparatus may be outputted as voltages or current with two states. As a difference between the values of the respective states is large, it is easy to identify the two states.

In this regard, if a voltage difference between the respective states is broaden to ensure easy identification of the two states, noise generated while a voltage transitions from one state to the other state may degrade the reliability of identifying an output signal. Further, because power consumption increases, inappropriateness may be caused in a small-sized electronic apparatus which requires low power consumption.

SUMMARY

An output apparatus which minimizes noise generation while a voltage transitions is described herein.

Also, an output apparatus which minimizes, through a simple configuration, noise generation according to transition of a voltage and is thus appropriate for miniaturization and an output system including the same are described herein.

In an embodiment of the present invention, an output apparatus includes: an output driving unit configured to drive a final output signal in response to an output signal; an output compensating signal generation unit configured to generate a delayed output signal by delaying the output signal by a predetermined time, and generate an output compensating signal based on the delayed output signal and the output signal; and an output driving compensation unit configured to compensate for the final output signal to a level opposite to a level to which the final output signal is driven, in response to the output compensating signal.

In an embodiment of the present invention, an output apparatus includes: an output driving unit configured to drive a final output signal between a first voltage and a second voltage in response to an output signal; and an output driving compensation unit having at least one compensating driving device with a smaller driving capacity than the output driving unit, and configured to connect the driving device to the first voltage or the second voltage to compensate for the final output signal to a level opposite to a level to which the final output signal is driven, in response to an output compensating signal.

In an embodiment of the present invention, an output system includes: a control apparatus configured to provide an output activation signal and control the output operation; and an output apparatus configured to drive an output signal in response to the output activation signal and provide a final output signal to an output pad, the output apparatus including: an output driving unit configured to drive the final output signal in response to the output signal; an output compensating signal generation unit configured to generate a delayed output signal by delaying the output signal by a predetermined time, and generate an output compensating signal based on the delayed output signal and the output signal; and an output driving compensation unit configured to compensate for the final output signal to a level opposite to a level to which the final output signal is driven, in response to the output compensating signal.

In an embodiment of the present invention, an output apparatus includes: an output driving unit configured to drive a final output signal from a connection node of a first driving transistor and a second driving transistor; an output compensating signal generation unit configured to generate a first delayed output signal, a second delayed output signal, and a high output compensating signal; and an output driving compensation unit configured to compensate for a voltage of the final output signal in response to the high output compensating signal and a low output compensating signal.

In one embodiment, the output compensating signal generation unit may comprise a low output compensating signal generating section configured to generate the first delayed output signal; and a high output compensating signal generating section configured to generate the second delayed output signal.

In one embodiment, the first delayed output signal and the second delayed output signal may have the same logic state.

In one embodiment, the output driving compensation unit may comprise: a first compensating transistor configured to prevent the final output signal from falling under a preset level when the final output signal is driven to a low level; and a second compensating transistor configured to prevent the final output signal from rising over the preset level when the final output signal is driven to a high level. For example, the first compensating transistor and the second compensating transistor may be smaller than the first driving transistor and the second driving transistor.

Thanks to the above embodiments, each of the output apparatuses according to the embodiments may minimize, through a simple configuration, noise generation according to change of a voltage.

In the output system including the output apparatus according to each of the embodiments, since noise generation according to change of an output voltage is minimized, reliability is improved, and since reliability according to transition of a voltage may be ensured, it is possible to guarantee a smooth operation even when an operating speed increases.

BRIEF DESCRIPTION OF THE DRAWINGS

Features, aspects, and embodiments are described in conjunction with the attached drawings, in which.

DETAILED DESCRIPTION

Hereinafter, an output apparatus and an output system including the same according to the present invention will be described below with reference to the accompanying drawings through various embodiments.

Figure 1:
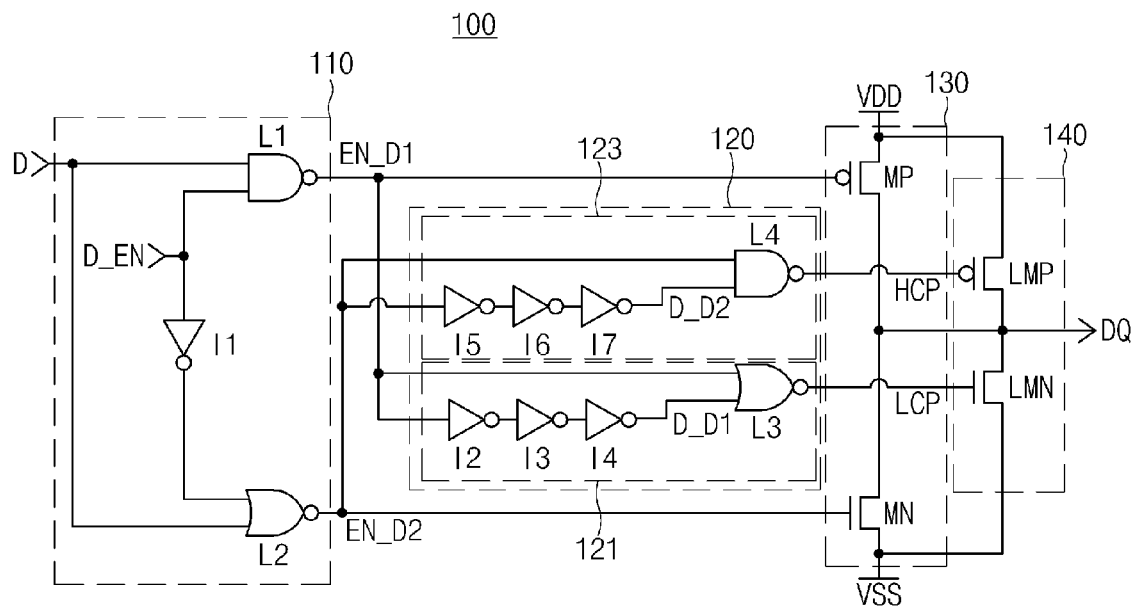
FIG. 1 is a diagram showing an output apparatus in accordance with an embodiment.

FIG. 1 is a diagram showing an output apparatus 100 according to an embodiment of the present invention.

According to an embodiment, the output apparatus 100 shown in FIG. 1 may be a part of an output apparatus. The output apparatus 100 may further include various component elements in addition to the component elements shown in FIG. 1.

Referring to FIG. 1, the output apparatus 100 may include an input providing unit 110, an output compensating signal generation unit 120, an output driving unit 130, and an output driving compensation unit 140.

The input providing unit 110 may provide first and second active output signals EN_D1 and EN_D2 based on an output signal D and an output activation signal D_EN. According to an embodiment, the input providing unit 110 may provide the first and second active output signals EN_D1 and EN_D2 by performing a logical operation for the output signal D and the output activation signal D_EN.

For instance, the input providing unit 110 may include a first inverter I1, a first logical operator L1, and a second logical operator L2.

The first logical operator L1 may perform NANDing (for example, a NAND operation) for the output signal D and the output activation signal D_EN, and generate the first active output signal EN_D1.

The second logical operator L2 may perform NORing (for example, a NOR operation) for the output activation signal D_EN inverted through the first inverter I1 and the output signal D, and generate the second active output signal EN_D2.

According to an embodiment, the first active output signal EN_D1 and the second active output signal EN_D2 may be signals which have the same logic state. For instance, in the state in which the output activation signal D_EN is activated, the first active output signal EN_D1 and the second active output signal EN_D2 may correspond to the inverted signal of the output signal D.

The output compensating signal generation unit 120 may be configured to generate a high output compensating signal HCP and a low output compensating signal LCP based on the first and second active output signals EN_D1 and EN_D2.

The output compensating signal generation unit 120 may include a low output compensating signal generating section 121 and a high output compensating signal generating section 123. Each of the low output compensating signal generating section 121 and the high output compensating signal generating section 123 may include a plurality of inverters and a logical operator. In detail, the low output compensating signal generating section 121 may include second to fourth inverters I2, I3 and I4 and a third logical operator L3; and the high output compensating signal generating section 123 may include fifth to seventh inverters I5, I6 and I7 and a fourth logical operator L4.

The low output compensating signal generating section 121 may be configured to receive the first active output signal EN_D1, toggle the first active output signal EN_D1 through the second to fourth inverters I2, I3 and I4, and generate a first delayed output signal D_D1. While it is shown in FIG. 1 that the low output compensating signal generating section 121 includes three inverters, it is to be noted that the low output compensating signal generating section 121 may include an odd number of inverters. This is because the first active output signal EN_D1 corresponds to the inverted signal of the output signal D. It may be envisaged that the low output compensating signal generating section 121 may include an even number of inverters according to an embodiment. Therefore, the number of inverters may differ according to embodiments.

Further, the number of inverters may be controlled in consideration of not only such logic states but also a time by which the first active output signal EN_D1 is delayed as it passes through each inverter and a desired total delay time.

The third logical operator L3 may perform NORing (for example, a NOR operation) for the first active output signal EN_D1 and the first delayed output signal D_D1, and generate the low output compensating signal LCP.

The high output compensating signal generating section 123 may be configured to receive the second active output signal EN_D2, toggle the second active output signal EN_D2 through the fifth to seventh inverters I5, I6 and I7, and generate a second delayed output signal D_D2. As described above, while it is shown in an embodiment that the high output compensating signal generating section 123 may include three inverters, it is to be noted that the high output compensating signal generating section 123 may be realized to include an odd number of inverters. It may be envisaged that the high output compensating signal generating section 123 may be configured to include one or more inverters according to an embodiment.

The fourth logical operator L4 may perform NANDing (for example, a NAND operation) for the second active output signal EN_D2 and the second delayed output signal D_D2, and generate the high output compensating signal HCP.

According to an embodiment, the first delayed output signal D_D1 and the second delayed output signal D_D2 may be signals which have the same logic state. Although it was described above that both the third logical operator L3 and the fourth logical operator L4 perform NOT operations, it is to be understood that other logical operations may be performed according to logic states.

In the present specification, the output signal D may undergo NOT operations through the first and second logical operators L1 and L2 in the input providing unit 110; and the resultant first and second active output signals EN_D1 and EN_D2 may be provided to the output compensating signal generation unit 120. Therefore, the output compensating signal generation unit 120 may be realized by an odd number of inverter devices to delay and invert the received first and second active output signals EN_D1 and EN_D2. The third and fourth logical operators L3 and L4 may also be realized to perform NOT operations. As described above, this is only for exemplification. Thus, the kinds of logical operations may be changed according to an embodiment, and the number of inverters is not limited as described above.

The output driving unit 130 may include a first driving transistor MP and a second driving transistor MN. The first driving transistor MP and the second driving transistor MN may be connected between a power supply voltage VDD and a ground voltage VSS and may provide a final output signal DQ. The final output signal DQ may be provided from the connection node of the first driving transistor MP and the second driving transistor MN.

The first driving transistor MP may provide the power supply voltage VDD as the final output signal DQ in response to the first active output signal EN_D1, and the second driving transistor MN may provide the ground voltage VSS as the final output signal DQ in response to the second active output signal EN_D2.

The first driving transistor MP may include a first terminal which is connected with the power supply voltage VDD, a gate terminal which is applied with the first active output signal EN_D1, and a second terminal which provides the final output signal DQ.

The second driving transistor MN may include a first terminal which is connected with the ground voltage VSS, a gate terminal which is applied with the second active output signal EN_D2, and a second terminal which provides the final output signal DQ.

Since the first active output signal EN_D1 and the second active output signal EN_D2 may have the same logic state as described above, the first driving transistor MP and the second driving transistor MN may be configured by switching devices which operate complementarily.

Accordingly, when the first active output signal EN_D1 and the second active output signal EN_D2 transition to a logic high state, the first driving transistor MP may be turned off and the second driving transistor MN may be turned on, by which the final output signal DQ may be driven to a low level.

Conversely, when the first active output signal EN_D1 and the second active output signal EN_D2 transition to a logic low state, the first driving transistor MP may be turned on and the second driving transistor MN may be turned off, by which the final output signal DQ may be driven to a high level.

The output driving compensation unit 140 may be configured to compensate for the voltage of the final output signal DQ in response to the high output compensating signal HCP and the low output compensating signal LCP.

In an embodiment, the output driving compensation unit 140 may include a first compensating transistor LMP and a second compensating transistor LMN.

Referring to FIG. 1, the first compensating transistor LMP may include a first terminal which is connected with the power supply voltage VDD, a gate terminal which is applied with the high output compensating signal HCP, and a second terminal which provides the final output signal DQ. The second compensating transistor LMN may include a first terminal which is connected with the ground voltage VSS, a gate terminal which is applied with the low output compensating signal LCP, and a second terminal which may provide the final output signal DQ.

The first compensating transistor LMP may be turned on for a preset time and raise the level of the final output signal DQ in the case where the second driving transistor MN is turned on and the final output signal DQ may be driven to the low level. The second compensating transistor LMN may be turned on for a preset time and lower the level of the final output signal DQ in the case where the first driving transistor MP is turned on and the final output signal DQ is driven to the high level.

In other words, the first compensating transistor LMP may prevent the final output signal DQ from falling under a preset level when the final output signal DQ is driven to the low level, and the second compensating transistor LMN may prevent the final output signal DQ from rising over a preset level when the final output signal DQ is driven to the high level.

As a result, it may be mentioned that the output driving compensation unit 140 may suppress a ringing phenomenon when a voltage abruptly changes. While a termination scheme may be used in order to suppress the ringing phenomenon of the output apparatus 100, an area required for termination may not be appropriate for a recently developed small-sized electronic appliance. Further, in a low power apparatus with a reduced magnitude of a power supply voltage VDD, a voltage itself used for termination may be inappropriate. Therefore, in the present disclosure, the output driving compensation unit 140 may be provided to minimize the ringing phenomenon.

Because the first compensating transistor LMP and the second compensating transistor LMN perform a compensating function, they may have a considerably small size when compared to the first driving transistor MP and the second driving transistor MN. Accordingly, even though the output driving compensation unit 140 is provided, a rate at which the size of the output apparatus 100 increases may be controlled to be insignificant.

While transistors were exemplified in FIG. 1 as driving devices for driving the final output signal DQ to a predetermined voltage level, any driving devices capable of raising or lowering a voltage level may be applied.

Figure 2:
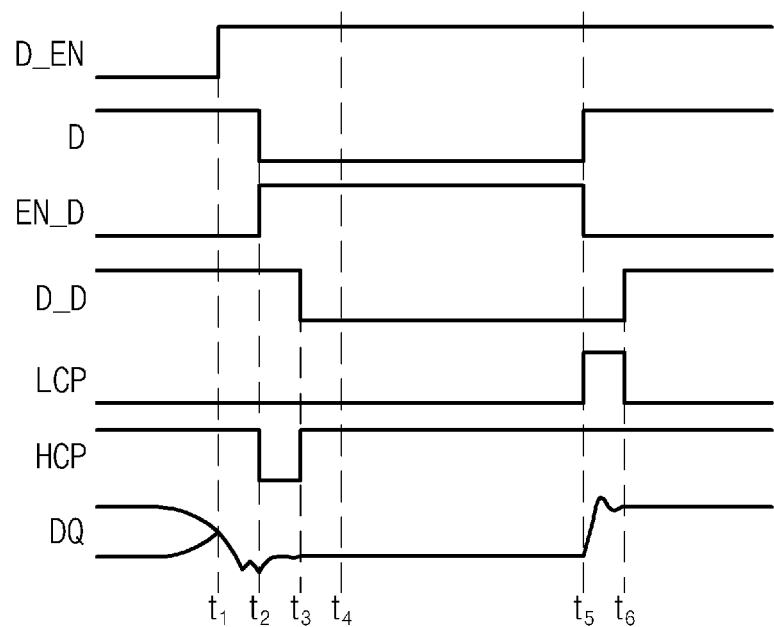
FIG. 2 is a timing diagram explaining operations of the output apparatus according to an embodiment of the present invention.

FIG. 2 is a timing diagram explaining operations of the output apparatus 100 according to an embodiment of the present invention.

Hereinafter, descriptions will be made with reference to FIGS. 1 and 2, for the cases where the output signal D transitions from high to low and from low to high.

Since the first active output signal EN_D1 and the second active output signal EN_D2 may be signals with the same logic state as described above, they will be collectively referred to as an active output signal EN_D. Further, since the first delayed output signal D_D1 and the second delayed output signal D_D2 may be signals with the same logic state, they will be collectively referred to as a delayed output signal D_D.

At a time of t1, the output activation signal D_EN may be activated. The output activation signal D_EN may be activated in response to an instruction signal such as a command signal. Because an output operation is not started before the time of t1, the final output signal DQ may be in a DC (don't care) state.

At a time of t2, the output signal D may transition from high to low. According to this fact, the active output signal EN_D may transition from low to high. When simply summarizing a logical operation by referring to the configuration of the input providing unit 110 in FIG. 1, in the state in which the output activation signal D_EN is activated, the active output signal EN_D may correspond to an inverted signal of the output signal D.

At the time of t2, as the active output signal EN_D transitions, the fourth logical operator L4 may activate the high output compensating signal HCP. As will be described below, since the delayed output signal D_D corresponds to a signal which is acquired by delaying the output signal D by a predetermined time, even though the output signal D transitions, the delayed output signal D_D may transition after the predetermined time (for example, a time between the time of t2 and a time of t3 in FIG. 2) has passed. The predetermined time may correspond to a time period during which a compensating operation is performed.

Thus, at the time of t2, the first driving transistor MP may be turned off and the second driving transistor MN may be turned on, in response to the active output signal EN_D. Moreover, the first compensating transistor LMP may be turned on in response to the high output compensating signal HCP. Because the low output compensating signal LCP retains the same low level, the second compensating transistor LMN may be in a turned-off state.

As the output signal D transitions, the second driving transistor MN may drive the final output signal DQ to a low state. However, in the case of a high speed operation, since a ringing phenomenon may occur due to the transition of the final output signal DQ, the first compensating transistor LMP may connect the final output signal DQ with the power supply voltage VDD and compensate for the ringing phenomenon. As described above, the first compensating transistor LMP may have a considerably small size when compared to the first driving transistor MP and/or the second driving transistor MN. Hence, the driving capacity of the first compensating transistor LMP may also be considerably small when compared to the second driving transistor MN. As a consequence, even when the first compensating transistor LMP is turned on and the final output signal DQ is connected to the power supply voltage VDD, the logic state of the final output signal DQ may not be changed.

The output compensating signal generation unit 120 may generate the delayed output signal D_D which is delayed as the active output signal EN_D passes through the plurality of inverters I2, I3, I4, I5, I6 and I7. The delayed output signal D_D may transition from high to low at the time of t3. For instance, the delayed output signal D_D may correspond to a signal which is acquired as the active output signal EN_D is delayed by the predetermined time and is then inverted. As a result, the delayed output signal D_D may correspond to a delayed signal of the output signal D.

At the time of t3, the high output compensating signal HCP may be deactivated in response to the delayed output signal D_D. The low output compensating signal LCP may not be changed. As the high output compensating signal HCP is deactivated, the first compensating transistor LMP may be turned off. The output driving compensation unit 140 may not operate, and the final output signal DQ may be stabilized and may be determined as a logic low state.

During the period between the time of t2 and the time of t3, the output driving compensation unit 140 may perform a compensating operation. The corresponding period may be set according to the delay time of the output compensating signal generation unit 120.

For example, the output apparatus 100 may determine the logic state of the final output signal DQ at a time of t4 after the final output signal DQ has been sufficiently stabilized through the compensating operation.

In a similar manner, when the output signal D transitions from low to high at a time of t5, the active output signal EN_D may transition from high to low, and accordingly, the low output compensating signal LCP may be activated.

The first driving transistor MP may be turned on and the second driving transistor MN may be turned off in response to the active output signal EN_D, and the final output signal DQ may transition to high. However, as described above, a ringing phenomenon may occur due to the transition of the final output signal DQ, and in order to compensate for the ringing phenomenon, the second compensating transistor LMN may be turned on in response to the low output compensating signal LCP. Because the high output compensating signal HCP retains the high logic state, the first compensating transistor LMP may be in a turned-off state.

FIG. 2 also illustrates a time t6. Therefore, as the final output signal DQ driven to high according to the first driving transistor MP is connected to the level of the ground voltage VSS by the second compensating transistor LMN, the ringing phenomenon may be minimized.

As can be readily seen from the above descriptions, in the output apparatus 100 according to an embodiment of the present invention of the present disclosure, when the final output signal DQ transitions, a compensation unit with a small driving capacity, that is, the output driving compensation unit 140 in an embodiment may be driven to a level opposite to the final output signal DQ, thereby minimizing the ringing phenomenon and noise generation.

As a consequence, unstableness of the final output signal DQ due to ringing may be minimized even in a high speed operation, and an increase in the area of the output apparatus 100 may become not substantial.

Figure 3:
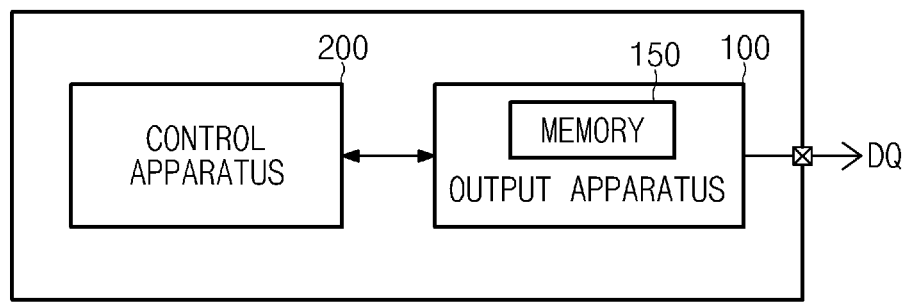
FIG. 3 is a block diagram showing an output system including the output apparatus of FIG. 1.

FIG. 3 is a block diagram showing an output system including the output apparatus of FIG. 1.

Referring to FIG. 3, an output system 10 may include an output apparatus 100 and a control apparatus 200.

The output apparatus 100 may provide a final output signal DQ to an external apparatus in response to a control signal provided from the control apparatus 200.

The control apparatus 200 may provide an output signal D or an output activation signal D_EN for activating an output operation, to the output apparatus 100. Also, according to an embodiment, the control apparatus 200 may activate or deactivate the operation itself of an output driving compensation unit 140 included in the output apparatus 100, regardless of the output signal D.

According to an embodiment, the control apparatus 200 may execute the program stored in a memory 150. The control apparatus 200 may be a microprocessor, a digital signal processor, a micro controller, or a similar apparatus.

Further, according to an embodiment, the output apparatus 100 may further include the memory 150. The memory 150 may store data, and data may be provided to an outside as the final output signal DQ. While it is shown in FIG. 3 that the memory 150 is included in the output apparatus 100, the memory 150 may be realized separately from the output apparatus 100.

For instance, the memory 150 may be a nonvolatile or volatile memory.

For example, the output system 10 as a mobile system may be a portable computer, a tablet, a digital music player or a memory card. While not shown, the output system 10 may further include an input unit such as a keyboard, a mouse and a touch pad, and a display for providing a user interface.

The output apparatus 100 and the output system 10 according to an embodiment of the present invention may be suitable for a mobile appliance, and may minimize the ringing phenomenon despite the transition of the final output signal DQ since the output driving compensation unit 140 with substantially the same effect as termination is provided.

While certain embodiments have been described above, it will be understood to those skilled in the art that the embodiments described are by way of example only. Accordingly, the output apparatus and the output system including the same described herein should not be limited based on the described embodiments. Rather, the output apparatus and the output system including the same described herein should only be limited in light of the claims that follow when taken in conjunction with the above description and accompanying drawings.

What is claimed is:

1. An output apparatus comprising:
    an output driving unit configured to drive a final output signal between a first voltage and a second voltage in response to an output signal;
    an output driving compensation unit having at least one compensating driving device with a smaller driving capacity than the output driving unit, and configured to connect the driving device to the first voltage or the second voltage to compensate for the final output signal to a level opposite to a level to which the final output signal is driven, in response to an output compensating signal; and
    a memory configured to store data corresponding to the output signal.

2. The output apparatus according to claim 1, wherein the output driving unit comprises a first driving device and a second driving device which are connected between the first voltage and the second voltage and operate complementarily in response to the output signal, and the final output signal is provided to a connection node between the first driving device and the second driving device.

3. The output apparatus according to claim 2, wherein the compensating driving device comprises a first compensating transistor which connects the connection node with the first voltage in response to an output compensating signal, and a second compensating transistor which connects the connection node with the second voltage in response to the output compensating signal.

4. The output apparatus according to claim 1, further comprising:
an output compensating signal generation unit configured to perform a logical operation for the output signal and a delayed output signal which is acquired by delaying the output signal by a predetermined time, and generate the output compensating signal.

5. The output apparatus according to claim 4, further comprising:
an input providing unit configured to perform a logical operation for an output activation signal and the output signal, and provide the output signal to the output driving unit and the output compensating signal generation unit.

6. The output apparatus according to claim 4, wherein the output driving compensation unit selectively connects the driving device for the predetermined time in response to the output signal.

7. An output system comprising:
a control apparatus configured to provide an output activation signal and control the output operation; and
an output apparatus configured to drive an output signal in response to the output activation signal and provide a final output signal to an output pad,
the output apparatus comprising:
an output driving unit configured to drive the final output signal in response to the output signal, the output driving unit including high and low driving devices;
an output compensating signal generation unit configured to generate a delayed output signal by delaying the output signal by a predetermined time, and generate an output compensating signal based on the delayed output signal and the output signal; and
an output driving compensation unit configured to compensate for the final output signal to a level opposite to a level to which the final output signal is driven in response to the output compensating signal,
wherein the output driving compensation unit comprises one or more compensating driving devices which are realized to a size smaller than the high and low driving devices and have a smaller driving capacity than the high and low driving devices, and wherein the compensating driving devices interrupt a compensating operation in response to the output compensating signal after the predetermined time has passed.

8. The output system according to claim 7, wherein output compensating signal generation unit comprises:
a low output compensating signal generating section configured to perform a logical operation for an output signal and the delayed output signal, and generate a low output compensating signal which is activated for the predetermined time when the final output signal is driven to a high level; and
a high output compensating signal generating section configured to perform a logical operation for the output signal and the delayed output signal, and generate a high output compensating signal which is activated for the predetermined time when the final output signal is driven to a low level.

9. The output system according to claim 7,
wherein the one or more compensating driving devices comprise first and second driving devices,
wherein the first driving device compensates for the output driving signal to a low level direction in the case where the high driving device is activated, and
wherein the second driving device compensates for the output driving signal to a high level direction in the case where the low driving device is activated.

10. The output system according to claim 7, wherein the output compensating signal generation unit comprises a plurality of inverters which generate the delayed output signal and logical operators which generate the output compensating signal based on the delayed output signal and the output signal.

11. An output system comprising:
a control apparatus configured to provide an output activation signal and control the output operation; and
an output apparatus configured to drive an output signal in response to the output activation signal and provide a final output signal to an output pad,
the output apparatus comprising:
an output driving unit configured to drive the final output signal between a first voltage and a second voltage in response to the output signal;
an output driving compensation unit having at least one compensating driving device with a smaller driving capacity than the output driving unit, and configured to connect the driving device to the first voltage or the second voltage to compensate for the final output signal to a level opposite to a level to which the final output signal is driven, in response to an output compensating signal; and
a memory configured to store data corresponding to the output signal.

12. The output system according to claim 11, wherein the output driving unit comprises a first driving device and a second driving device which are connected between the first voltage and the second voltage and operate complementarily in response to the output signal, and the final output signal is provided to a connection node between the first driving device and the second driving device.

13. The output system according to claim 12, wherein the compensating driving device comprises a first compensating transistor which connects the connection node with the first voltage in response to the output compensating signal, and a second compensating transistor which connects the connection node with the second voltage in response to the output compensating signal.

14. The output system according to claim 11, further comprising:
an output compensating signal generation unit configured to perform a logical operation for the output signal and a delayed output signal which is acquired by delaying the output signal by a predetermined time, and generate the output compensating signal.

15. The output system according to claim 14, further comprising:
an input providing unit configured to perform a logical operation for an output activation signal and the output signal, and provide the output signal to the output driving unit and the output compensating signal generation unit.

16. The output system according to claim 14, wherein the output driving compensation unit selectively connects the driving device for the predetermined time in response to the output signal.

* * * * *